United States Patent [19]
Carrie et al.

[11] Patent Number: 6,134,784
[45] Date of Patent: Oct. 24, 2000

[54] METHOD OF MAKING SOLAR COLLECTORS BY IN-SITU ENCAPSULATION OF SOLAR CELLS

[75] Inventors: Peter J. Carrie, Toronto; Kingsley D. D. Chen, Markham, both of Canada

[73] Assignee: Photovoltaics International, LLC, Sunnyvale, Calif.

[21] Appl. No.: 09/385,115

[22] Filed: Aug. 27, 1999

[51] Int. Cl.[7] ................................................. B23P 15/26
[52] U.S. Cl. ......................................................... 29/890.033
[58] Field of Search ........................................ 29/890.033

[56] References Cited

U.S. PATENT DOCUMENTS

| | | | |
|---|---|---|---|
| 4,290,838 | 9/1981 | Reavill et al. | 156/286 |
| 5,593,532 | 1/1997 | Falk et al. | 156/285 |

Primary Examiner—J. Cuda
Assistant Examiner—Anthony L. Green
Attorney, Agent, or Firm—Thomas Schneck

[57] ABSTRACT

A method of making solar collectors by encapsulating photovoltaic cells within a base of an elongated solar collector wherein heat and pressure are applied to the cells in-situ, after an encapsulating material has been applied. A tool is fashioned having a bladder expandable under gas pressure, filling a region of the collector where the cells are mounted. At the same time, negative pressure is applied outside of the bladder, enhancing its expansion. The bladder presses against a platen which contacts the encapsulated cells, causing outgassing of the encapsulant, while heat cures the encapsulant. After curing, the bladder is deflated and the tool may be removed from the collector and base and reflective panels put into place, if not already there, thereby allowing the solar collector to be ready for use.

20 Claims, 7 Drawing Sheets

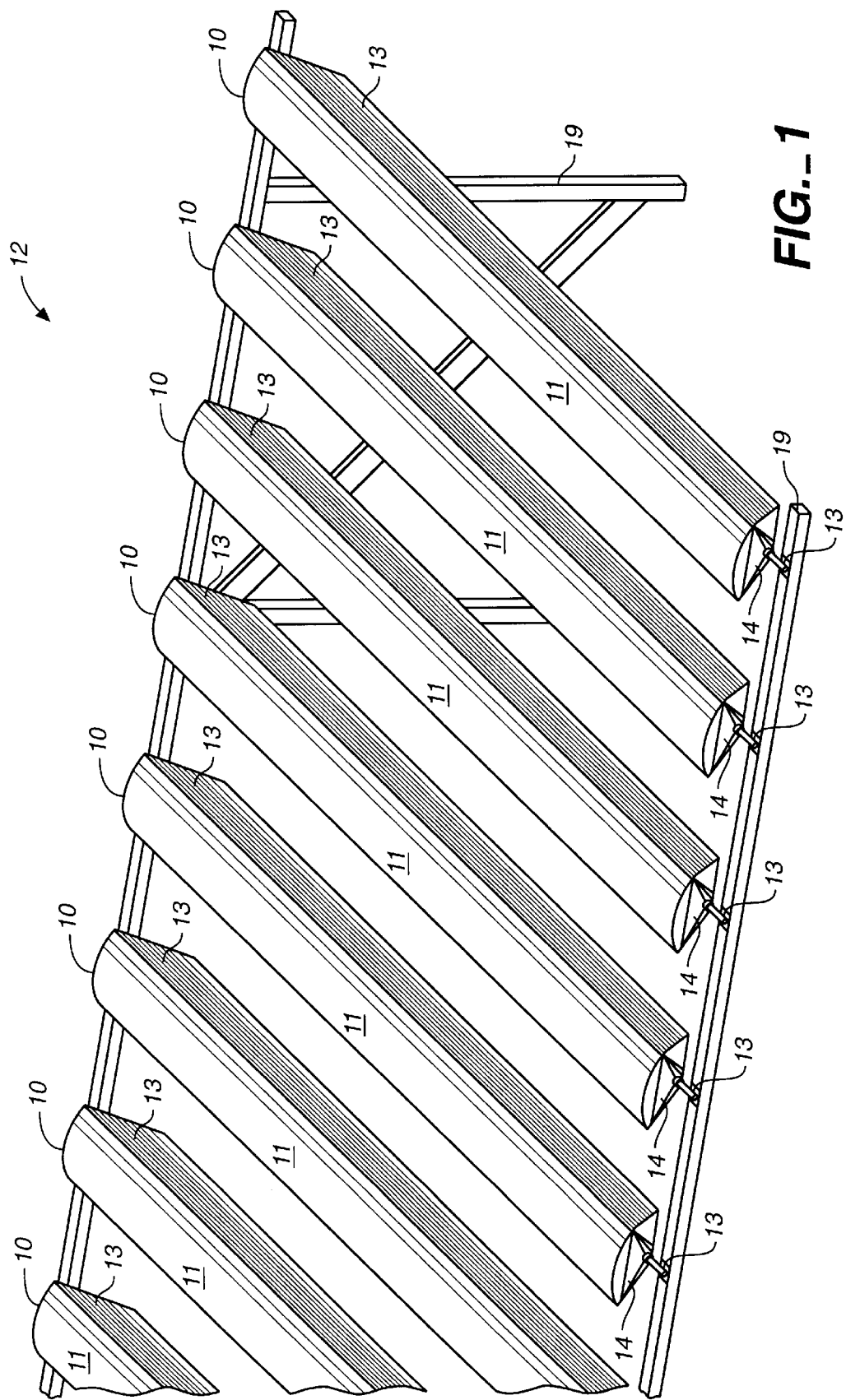
FIG._1

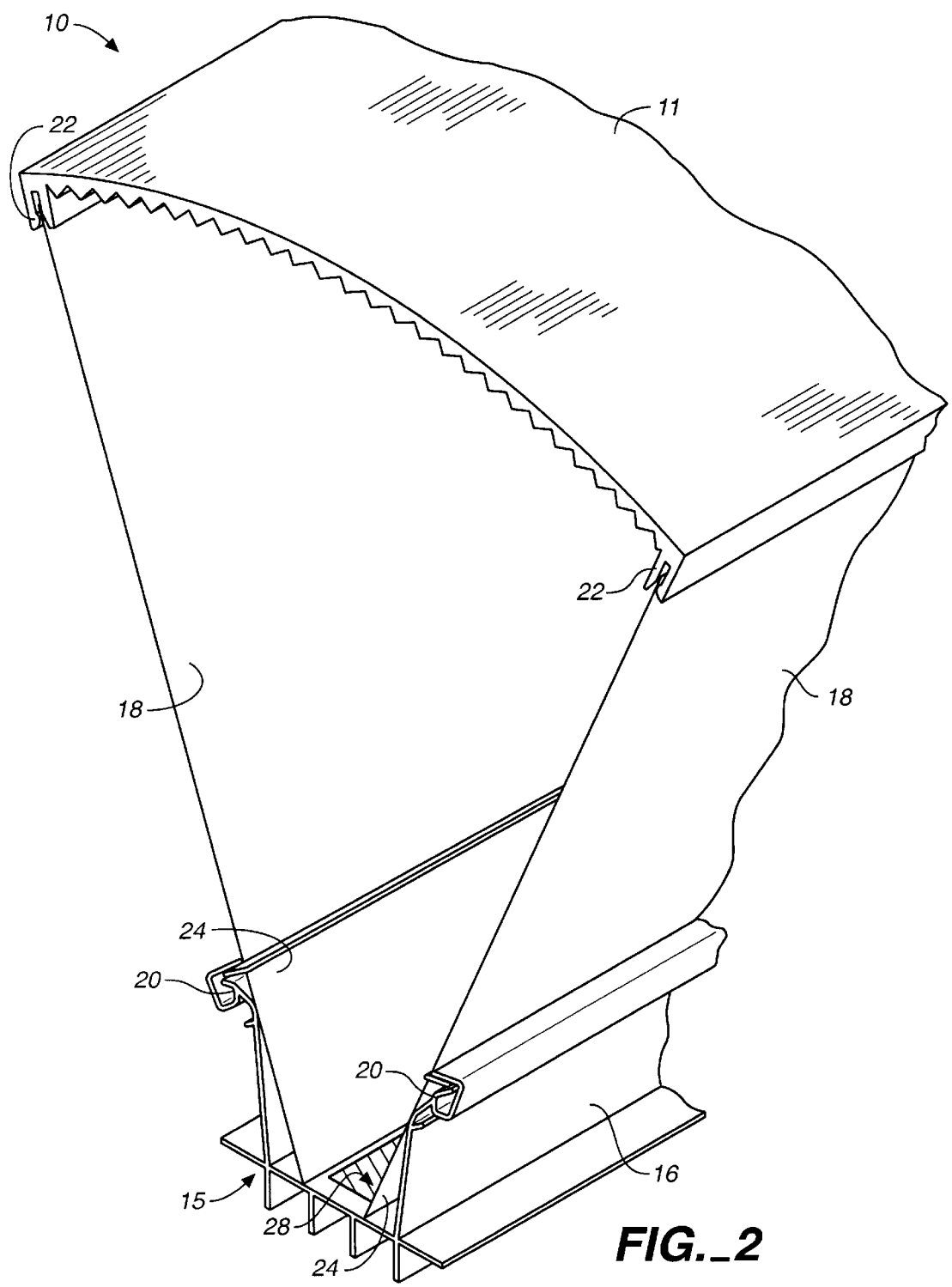
FIG._2

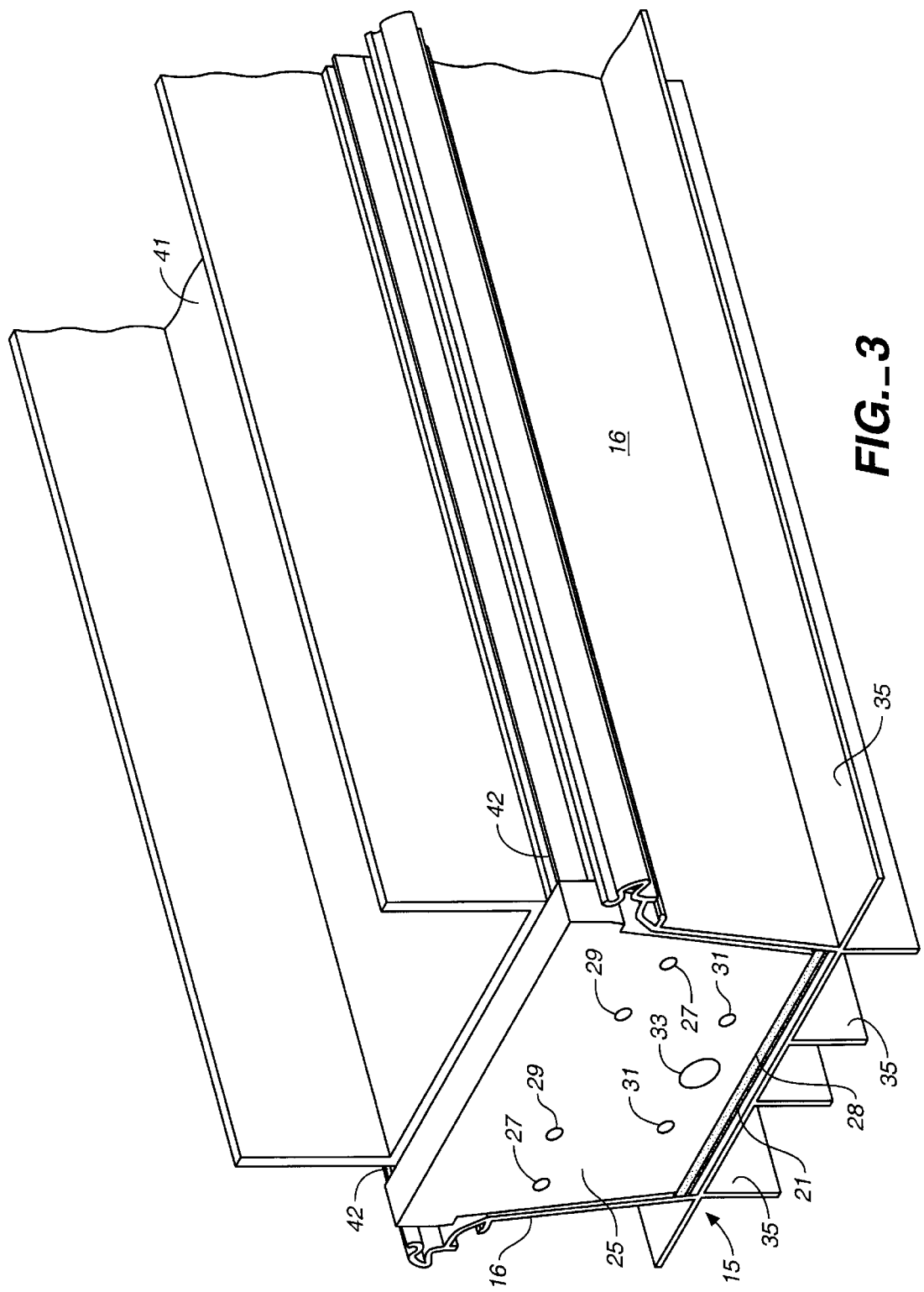
FIG._3

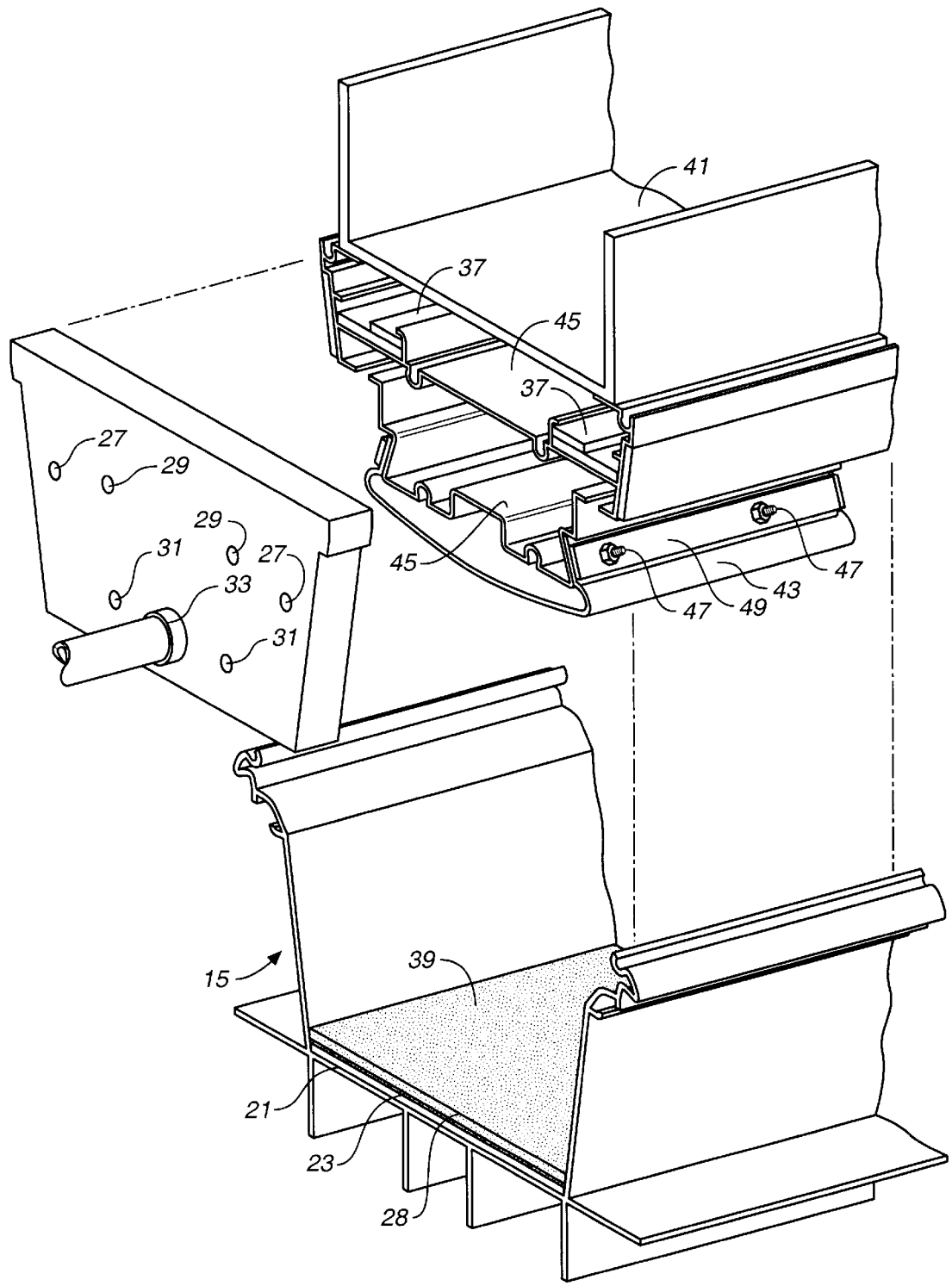
FIG._4

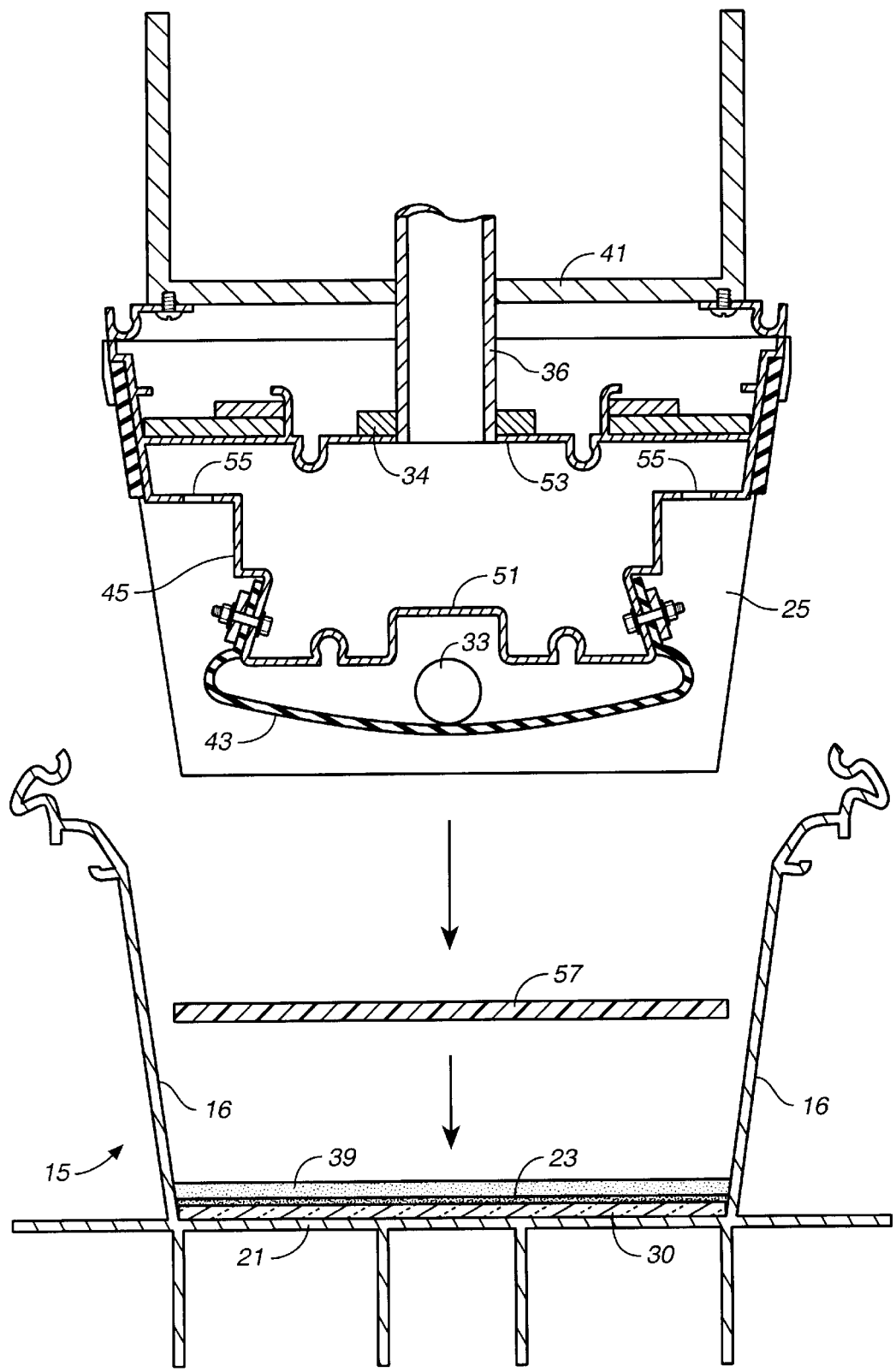
FIG._5

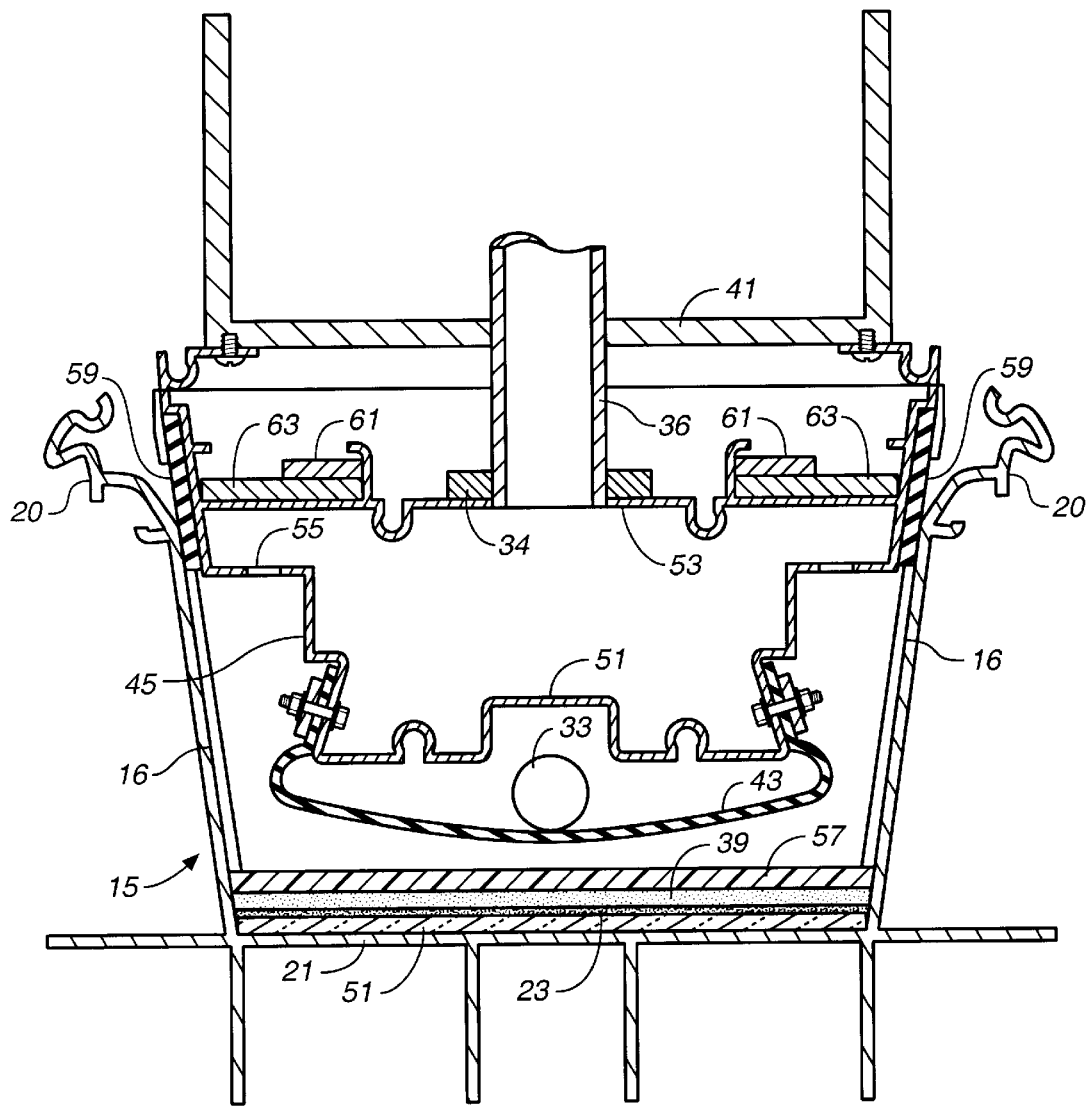
*FIG._6*

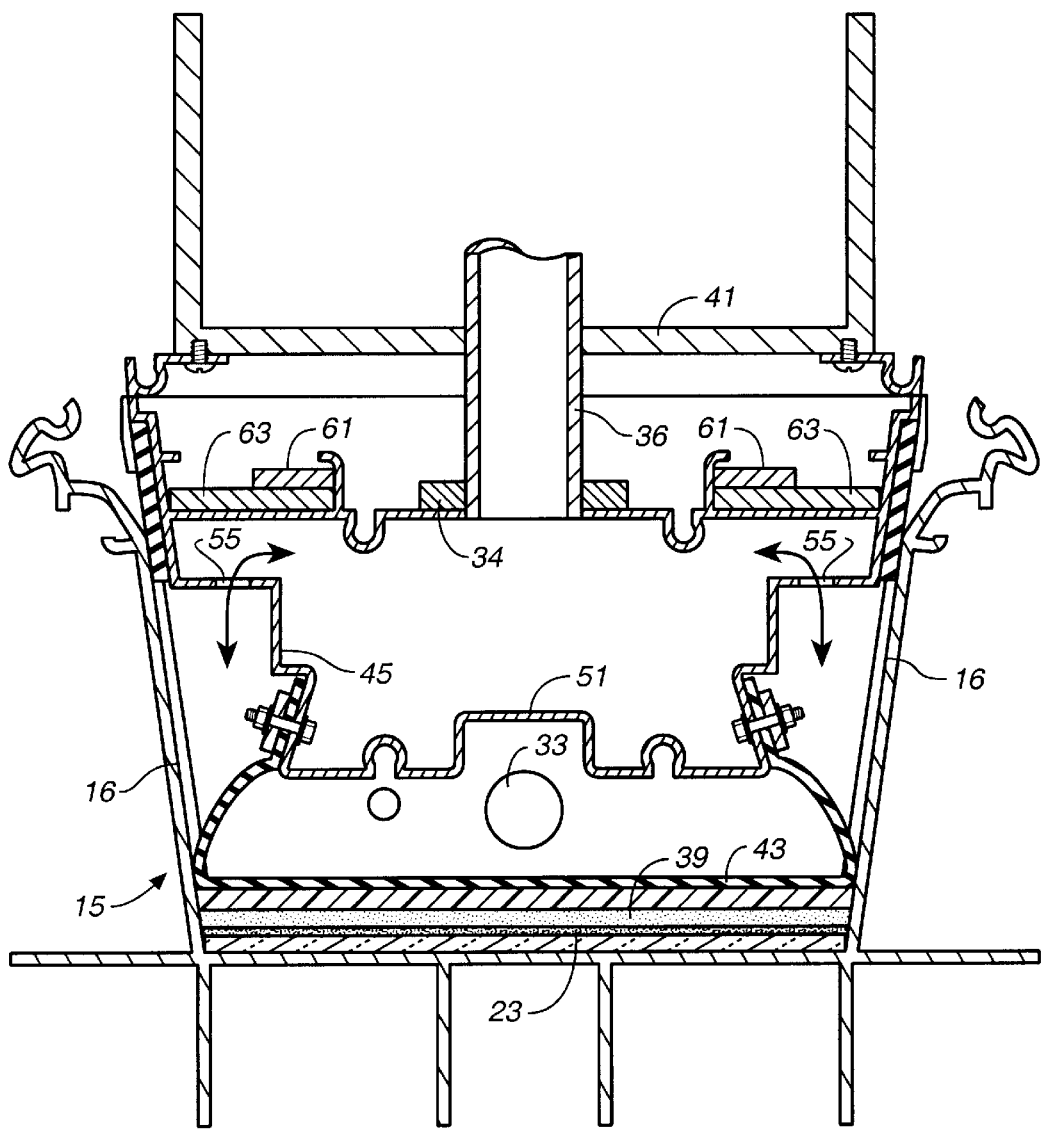
FIG._7

6,134,784

METHOD OF MAKING SOLAR COLLECTORS BY IN-SITU ENCAPSULATION OF SOLAR CELLS

TECHNICAL FIELD

The invention relates to manufacturing linear solar collectors and, in particular, to a method of mounting and protecting a web of solar cells in a linear solar collector.

BACKGROUND ART

Previous methods used to encapsulate and provide environmental protection for photovoltaic webs in linear solar collectors have used a variety of polymer-based resins and gels to seal photovoltaic cells and electrical connections from the environment. Such sealing is required to prevent corrosion of components and subsequent performance degradation. Ethyl vinyl acetate (EVA) is commonly used in the encapsulation of flat plate types of photovoltaic receivers. The present invention also uses EVA, but applies it in a new way.

In prior methods of applying EVA, or similar encapsulants, opposing forces are applied to both sides of the solar receiver module, in a vacuum environment. The vacuum is used to evolve dissolved gases and byproducts of the polymer curing process, and may also be used to induce the opposing force required to transport entrapped bubbles. Such a vacuum laminator is similar to a laundry press. The space between opposing plates is placed under vacuum and the polymeric resin is cured using heat, catalysis, or another method. Alternatively, a vacuum chamber is required, containing a means of applying the requisite pressure to the module or receiver.

In U.S. Pat. No. 5,593,532 J. Falk et al. describe a process for manufacturing photovoltaic laminated photovoltaic modules using a vacuum laminator with a heater plate to promote flow of the plastic sealing layers in the encapsulating materials. In U.S. Pat. No. 4,290,838 J. Reavill et al disclose a method for making printed circuits in which a sheet is laminated onto another sheet supported by a substrate with vacuum assistance for drawing air from between sheets to be laminated before they are pressed together. A press fixture is used to apply pressure and to hold the assemblage.

While all of the manufacturing techniques of the prior art have been useful, an object of the invention was to devise a more efficient way of mounting and laminating solar cells in linear solar collectors.

SUMMARY OF THE INVENTION

The above object has been achieved by using a solar collector structure itself as part of the encapsulating tool, particularly as a portion of a vacuum chamber. By using the collector structure itself, it is possible to apply a vacuum to a linear solar web or array to remove evolved gases while the web remains in its operating location. Such a linear shape could not normally be encapsulated in conventional vacuum laminators, but would have to be laminated in segments.

In accordance with the present invention, a web of photovoltaic cells is placed in an operating position on a surface of a linear solar collector structure. The cells are then coated with a light transmissive encapsulating substance, such as EVA. An expandable bladder is then inserted into the solar collector with outside walls capable of contacting the web of photovoltaic cells to communicate pressure to the web of cells. The expandable bladder is inflated thereby establishing pressure against the surfaces of the solar collector such that the pressure inside of the bladder exceeds the pressure outside of the outside wall of the bladder, which communicates pressure to the coating of the photovoltaic cells. The metal portions of the tool structure are heated to promote curing of the encapsulating substance. After curing, the bladder is deflated and removed from the linear solar collector and replaced by collector components, such as the lens and side wall portions where needed.

By using the solar collector structure as an integral part of the laminator tool, the cost, complexity and thermal mass of the apparatus is reduced. A reduction in the thermal mass of the apparatus has the benefit of reducing the amount of energy required to complete the encapsulation process. This, in turn, reduces harmful environmental emissions associated with power generation, and improves the life cycle energy balance of photovoltaic devices.

BRIEF DESCRIPTION OF THE DRAWINGS

FIG. 1 is a perspective view of a solar electric energy converter with linear collector structures employed in the method of the present invention.

FIG. 2 is an enlarged perspective view of a collector structure shown in FIG. 1 with an end cap removed.

FIG. 3 is a perspective view of a portion of a solar collector, shown in FIG. 2, working as a tool in accord with the method of the present invention.

FIG. 4 is an exploded view of the structure of FIG. 3.

FIGS. 5–7 are end views illustrating a method of assembling a solar web encapsulator in accord with the present invention.

BEST MODE FOR CARRYING OUT THE INVENTION

With reference to FIG. 1, a modular solar energy conversion assembly 12 consists of a plurality of solar concentrator units 10 mounted on a frame 19. The frame 19 is arranged such that the units 10 are aligned at an angle so as to be directly facing a source of radiant energy, typically the sun. Each solar energy conversion unit 10 includes a concentrator lens 11, a passive collector 13 and an active cell area, not shown. The concentrator lens is a curved, elongated Fresnel lens 11 which is attached to sidewalls of the collector. End caps 14 are secured on opposite ends of the solar concentrator unit 10 in order to complete the enclosure of unit 10. The construction of a concentrator unit 10, as shown, is more fully described in patent application Ser. No. 09/273,083, entitled Tracking Solar Energy Conversion Unit Adapted for Field Assembly, assigned to the assignee of the present invention. In that application, the passive solar collector is described as formed with two elongated parallel panels held by an extruded base having upright wings, as may be seen in FIG. 2.

The present invention uses a lower portion of the passive collector 13 as part of a tool for seating active solar cells. As seen in FIG. 2, a solar concentrator unit 10 of the present invention has its end caps removed. The lens 11 is connected to the upper wall panels 18 by a pair of snap-fit upper joints 22, consisting of folk-like tangs which engage both sides of the rim of opposing walls. The upper wall panels 18 extend downward from the lens 11 converging toward each other at an angle. The bottom edges of the upper wall panels 18 are connected to linear clips forming a unique lower joint at the ends of opposed wings 16 of an aluminum, U-shaped, heat sink base 15. Heat sink base 15 is important because it is employed as part of a tool for mounting of the solar cells 28 to the base. Also connected to the clips are specularly reflective lower panels 24, as part of the sidewall, designed to capture light from the lens on the first impingement upon surface and direct such light onto the active surface, i.e. solar cells.

Clip joints 20 are formed as the uppermost part of the opposed upright wings 16 of the heat sink 15 and serve as double joints. On the one hand, the clip joints 20 connect the upper wall panels 18 to the heat sink 16. On the other hand, the clip joints 20 also connect lower reflector panels 24 to the wings 16 so that the upper wall panels and the lower reflector panels lie in the same plane. Both panels are sheet metal having edges to engage the clip joints 20, as described below.

An array of photovoltaic cells 28 are arranged on a horizontal surface on the base of the heat sink 15, the photovoltaic cells 28 facing upwards and opposing the lens 11 in a position where the cells will work as solar energy converters when the collector is in an operational mode. This is known as the operating position for the cells. The cells are laid flat on the heat sink base. The cells are photo-electrically active diodes which are placed over an insulating substrate and then coated with a clear, protective overcoat which is non-reactive to UV light, such as EVA. The photovoltaic cells 28 receive solar light through the lens 11, as well as from the passive collector, and generate current at an electrical potential to produce useful electrical energy. The heat sink 15 with a base, and outwardly extending upright wings functions to transfer heat away from the photovoltaic cells 28 in order to maintain a proper operating temperature for the photovoltaic cells.

With reference to FIG. 3, the heat sink 15 and an upper surface serving as a base 21 are seen, between opposed wings 16. Reflector panels and fresnel collector lens have been removed, or not yet installed, both situations regarded as equivalent. A web of solar cells 28 reside on the base in the operating position and are encapsulated by the encapsulating tool of the present invention. A U-shaped lid 41 and feet 42, which reside atop a hollow fixture, serving as a tool inserted above the web, seal the entire assembly in a gas tight manner. The term "gas tight" means that gas cannot escape into or out of the fixture except through holes which are specially provided for that purpose. Holes 27, 29 and 31 in the end cap are used to accomode screws to secure the end cap in place. Hole 33 in the end cap is used to apply positive or negative pressure to the interior of the sealed structure. Similarly, an internal port 34 may be used to apply positive or negative pressure to the peripheral portions of the sealed structure. Fins 35 are used to conduct heat to the base 21 of heat sink 15 during encapsulation. Lid 41, as well as heat sink 15, are elongated structures running the length of the collector assembly. The lid and the heat sink may be extruded aluminum members.

In FIG. 4 the interior of the encapsulating tool may be seen. The tool features an elastomeric bladder 43 which is mounted to an elongated vacuum manifold 45 by means of fasteners 47. A metal strip 49 distributes retentive force along the length of the bladder. Linear heater strips 37 may be seen to reside on the ceiling of the vacuum manifold 45. The corrugated shape of the vacuum manifold is for strength, yet allowing flexing under pressure upon inflation of the bladder. A web of solar cells 28 is shown below a layer of encapsulating material of the usual type, such as EVA.

In FIG. 5, the heat sink 15 is seen to have base 21 between upright wings 16. Atop base 21 is a thin insulative coating 30 which may be a thin layer of silicon dioxide separating the web of solar cells from the metal base 21. Atop the insulative coating 30 is a web of solar cells. The assembly is coated with the EVA encapsulant previously mentioned.

Vacuum manifold 45 is a closed plenum, seen having a floor 51 and a ceiling 53. The port 34 communicates pressure, say negative pressure, to the outer periphery of bladder 43 through pipe 36. At the same time the bladder 43 is inflated through pressure port 33. A platen 57 is placed temporarily above the encapsulating material 39. The removable platen is a stack of elastomeric and textile materials that are used to provide uniform pressure distribution, and provide a means for evolved gases to be vented from the work-piece. The configuration of the platen may be adjusted to accommodate differences in the durometer or hardness of the elastomer used for the bladder by substituting layers of different thickness or porosity. Bladder 43 will work against platen 57 which will transfer force to encapsulating material.

In FIG. 6, vacuum manifold 45 is seen to be positioned immediately above platen 57. The manifold is seen to have elastomeric seals 59 on opposite sides which will contact wings 16 to make a vacuum-tight seal. The upper edges of the wings 16 have outwardly diverging hooks 20, used to support solar collector panels, but which allow entry of seals 59 to make contact with the interior of the upwardly extending wings 16.

The ceiling 53 of manifold 45 supports linear heater strips 61 communicating heat to heat distribution strips 63 which are made of a good thermally conductive material, such as copper or aluminum. Heat is distributed to the heat sink 15 and to vacuum manifold 45 along its entire length to help prevent thermal deformation of the manifold due to temperature differences through the manifold. Heating of the base causes heating of the encapsulant.

In FIG. 7, bladder 43 is seen to be expanded by positive pressure applied through pressure port 31. Simultaneously, negative pressure is applied through port 34 which cause the walls of the bladder 43 to expand outwardly. Negative pressure is also drawn through port 34 on the inside of the vacuum manifold 45, with vacuum communication through apertures 55. The vacuum port is also useful for removing gases as encapsulant material cures. The amount of pressure to be applied is sufficient to force encapsulant material 39 into intimate contact with the web of solar cells 23, without damage to the web. Note that the bladder extends all the way to the corners of heat sink 15, making contact with the upright wings 16. Downward pressure may also be applied by beam 41, mainly to retain vacuum manifold 45 in place and prevent it from moving upwardly as the bladder is inflated. Heat causes curing of the encapsulating material, and pressure assists in removing evolved gases and voids in the encapsulant material. After curing, positive pressure may be released from inside of the bladder and negative pressure may be released from outside of the bladder returning all pressure to atmospheric conditions. The encapsulating tool of the present invention may then be removed.

What is claimed is:

1. A method of making a solar collector comprising,
    disposing a web of photovoltaic cells in an operating position in an elongated solar collector structure, and then encapsulating the photovoltaic cells with a coating in-situ in said operating position within the solar collector structure.
2. The method of claim 1 further defined by adding solar collector panels and a collector lens to the collector structure after encapsulating the photovoltaic cells.

3. The method of claim 2 further defined by installing end caps for the solar collector panels after encapsulating the photovoltaic cells.

4. The method of claim 1 wherein the encapsulating step is achieved by coating phtovoltaic cells with light transmissive liquid encapsulant material and then applying pressure upon the encapsulant in-situ.

5. The method of claim 4 wherein the applying of pressure upon the encapsulant is by inflating a bladder disposed over the encapsulant material.

6. A method of making a solar collector of the type having an encapsulated web of photovoltaic cells comprising, first disposing a web of photovoltaic cells in an operating position on a surface of a linear solar collector structure, then coating the photovoltaic cells with a light transmissive encapsulating substance, then inserting an expandable bladder into the solar collector with outside walls for pressure communication with the web of photovoltaic cells, then inflating the expandable bladder for establishing pressure against the surfaces inside of the solar collector with a gas whose pressure inside of the bladder exceeds the gas pressure outside of the bladder, whereby the outside wall of the bladder communicates pressure to the coating of the photovoltaic cells, then removing the bladder from the linear solar collector structure after curing of the encapsulating substance and then placing solar collector components in cooperative relation with the solar collector structure after removal of the bladder, including reflector panels and a collector lens.

7. The method of claim 6 further defined by inserting a platen between the bladder and the web of photovoltaic cells after coating with the encapsulating substance, as a removable tool for said pressure communication with the web of photovoltaic cells, the platen covering the photovoltaic cells.

8. The method of claim 6 wherein said inflating of the expandable bladder comprises placing the bladder in a closed solar collector and lowering air pressure on the outside walls of the bladder.

9. The method of claim 8 further defined by placing at least one pipe outside of the walls of the expandable bladder but inside of the closed solar collector and applying vacuum pumping in the space between the outside walls of the expandable bladder.

10. The method of claim 6 further defined by mounting the bladder on a beam insertable into a linear solar collector.

11. The method of claim 10 further defined by sealing the walls of the beam to walls of the solar collector thereby forming a closed plenum, in cross-section, occupied by the bladder.

12. The method of claim 6 further defined by end caps sealing the ends of the solar collector.

13. The method of claim 6 further defined by disposing at least one pipe outside of the walls of the expandable bladder but inside of the closed solar collector and applying vacuum pumping in the space between the outside walls of the expandable bladder.

14. The method of claim 10 further defined by applying linear seals along collector walls along positions where walls of the beam approach walls of the solar collector whereby sealing of the walls of the beam to walls of the solar collector is by said linear seals.

15. The method of claim 10 further defined by providing a pair of spaced apart pipes joined to said beam, said pipes outside of the walls of the expandable bladder but inside of the closed solar collector and applying vacuum pumping in the space between the outside walls of the expandable bladder.

16. A method of forming a solar collector of the type having an encapsulated web of photovoltaic cells comprising, disposing a web of photovoltaic cells within a U-shaped base, coating the web with a light transmissive encapsulant material, closing the base with a hollow gas tight fixture supporting an inflatable bladder disposed over the web, inflating the bladder to apply pressure to the encapsulant on the web, thermally curing the encapsulant by heating the base, deflating and removing the bladder and fixture from the base, and inserting solar collector panels into the base in place of the fixture and bladder, with a collector lens spanning the collector panels distal to the base.

17. The method of claim 16 further defined by inflating the bladder by applying positive pressure inside of the bladder.

18. The method of claim 16 further defined by inflating the bladder by applying pressure outside of the bladder.

19. The method of claim 16 further defined by thermally curing the encapsulant by heating the gas tight fixture.

20. The method of claim 16 further defined by placing an elongated platen between the bladder and the encapsulant and contacting the platen with the bladder.

* * * * *